United States Patent [19]

Sakaida

[11] 4,194,087
[45] Mar. 18, 1980

[54] CONTROL CIRCUIT AND FM STEREO RECEIVER USING SAME

[75] Inventor: Kaku Sakaida, Tokyo, Japan

[73] Assignee: Trio Kabushiki Kaisha, Tokyo, Japan

[21] Appl. No.: 903,783

[22] Filed: May 8, 1978

[30] Foreign Application Priority Data

May 17, 1977 [JP] Japan .................................. 52-56550

[51] Int. Cl.² ........................ H04H 5/00; H03K 5/153
[52] U.S. Cl. ............................. 179/1 GD; 179/1 GM; 320/1; 328/106; 307/294
[58] Field of Search ........... 179/1 GD, 1 GM; 320/1; 328/106; 307/109, 294

[56] References Cited

U.S. PATENT DOCUMENTS

| 3,388,271 | 6/1968 | Feiner et al. | 307/294 |
| 3,593,033 | 7/1971 | Shimizu | 328/106 |
| 3,711,652 | 1/1973 | Metro | 179/1 GM |
| 3,999,132 | 12/1976 | Smith | 179/1 GM |

Primary Examiner—Douglas W. Olms

Attorney, Agent, or Firm—Gerald J. Ferguson, Jr.; Joseph J. Baker

[57] ABSTRACT

Circuitry for generating from an input signal having leading and trailing edges at least two output control signals where the leading and trailing edges of the first one of the two output control signals respectively precede and follow the leading and trailing edges of the second one of the two output control signals, the circuitry comprising a first transistor responsive to the input signal; time constant circuit means having a predetermined time constant connected to the first transistor; a second and third transistors responsive to the first transistor and the time constant circuit means; bias means for so establishing different operating voltages for the second and third transistors that, upon application of the input signal to the first transistor, the first and second output control signals are respectively outputted by second and third transistors due to the fact that they are actuated at different times by the output signal from the first transistor and the time constant circuit depending on whether the input signal is rising or falling. Also an FM stereo receiver incorporating the above circuitry.

6 Claims, 5 Drawing Figures

FIG. 4
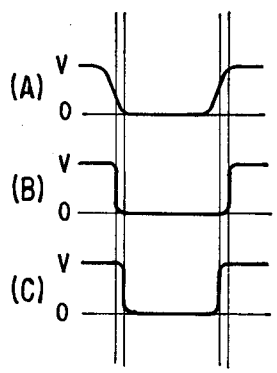
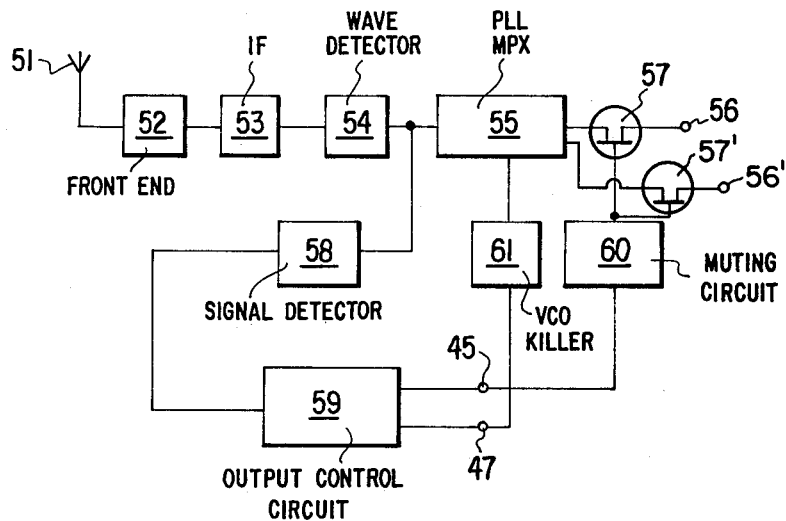
FIG. 5

CONTROL CIRCUIT AND FM STEREO RECEIVER USING SAME

BACKGROUND OF THE INVENTION

1. Field of the Invention

This invention relates to an output control circuit that produces a plurality of output control signals derived from one input signal where the leading edges of the control signals occur in a predetermined sequence while the trailing edges occur in a reverse sequence. The invention also relates to an FM stereo receiver which employs an output control circuit of the foregoing type.

2. Discussion of the Prior Art

Conventional output control circuits of the foregoing type use a plurality of Schmidt circuits where the bias of the first stage transistors of each circuit is different. An example of such circuitry is shown in FIG. 1, where 1 is a first Schmidt circuit. Schmidt circuit 1 comprises a first stage transistor 2, an after stage transistor 3, and resistors 4–10. 11 is a second Schmidt circuit. Schmidt circuit 11 similarly comprises a first stage transistor 12, an after stage transistor 13, and resistors 14–20. Resistors 5 and 15 are connected between the respective base and ground of first transistors 2 and 12 where resistor 5 < resistor 15. 21 and 22 are power supply terminals of first and the second Schmidt circuits 1 and 11; 23 is a common input signal source connected to the base of first stage transistors 2 and 12; and 24 and 25 are output terminals connected to the collectors of after stage transistors 3 and 13.

As mentioned above, resistors 5 and 15 that are connected between the respective base and ground of first stage transistors 2 and 12 where resistor 5 < resistor 15. Consequently, as shown in the FIG. 2(A) input signal waveform, when this input signal falls as shown in the diagram, first stage transistor 2 of first Schmidt circuit 1 first becomes nonconductive. Accordingly, after stage transistor 3 of Schmidt circuit 1 becomes conductive, which causes the output voltage at output terminal 24 of Schmidt circuit 1 to drop as shown in FIG. 2(B). Subsequently, first stage transistor 12 of second Schmidt circuit 11 becomes nonconductive, and accordingly, the output voltage of output terminal 25 of Schmidt circuit 11 similarly drops as shown in FIG. 2(C). On the other hand, when the input signal shown in FIG. 2(A) rises as shown in the diagram, first stage transistor 12 of second Schmidt circuit 11 first becomes conductive. Accordingly, after stage transistor 13 of Schmidt circuit 11 becomes nonconductive, which causes the output voltage at output terminal 25 of Schmidt circuit 11 to rise as shown in FIG. 2(C). Subsequently, first stage transistor 2 of first Schmidt circuit 1 becomes conductive, and accordingly, the output voltage at output terminal 24 of Schmidt circuit 1 similarly rises as shown in FIG. 2(B).

As described above, a conventional output control circuit uses a plurality of Schmidt circuits and, by changing the bias of the respective first stage transistors, it causes a plurality of output voltages originating from one input signal to rise with staggered timing and to fall with staggered timing in the reverse sequence. Consequently, in such an output control circuit, the number of transistors used substantially increases because Schmidt circuits are used. Thus, the circuitry tends to be complicated and costly.

SUMMARY OF THE INVENTION

This invention was made in view of the above-mentioned considerations and the purpose is to produce an output control circuit that reduces the number of transistors used thus resulting in simplified circuitry and reduced cost.

Other objects and advantages of this invention will be apparent from a reading of the following specification and claims taken with the drawing.

BRIEF DESCRIPTION OF THE DRAWING

FIGS. 4(A) through (C) are graphs of illustrative input signals and output voltage waveforms occurring in the FIG. 3 circuit.

FIG. 5 is a block diagram of an illustrative FM tuner using the FIG. 3 output control circuit.

DETAILED DESCRIPTION OF PREFERRED EMBODIMENTS

Figure 1:
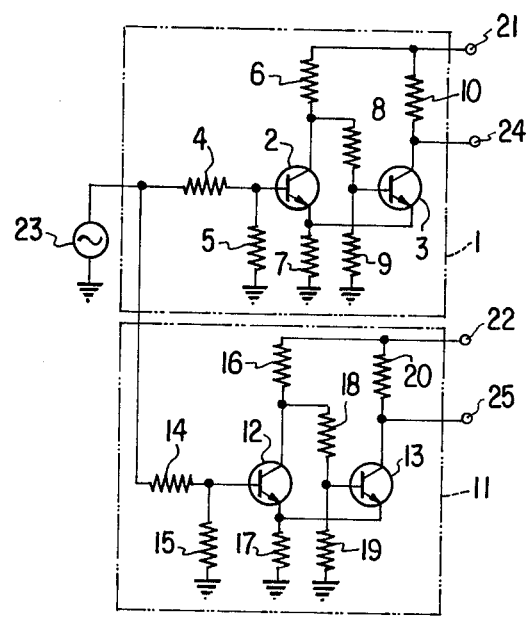
FIG. 1 is a circuit diagram of an illustrative, conventional output control circuit.
Figure 2:
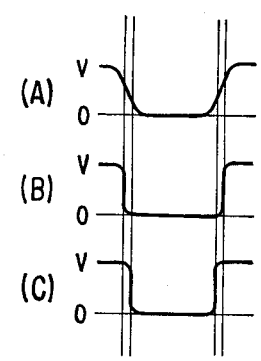
FIGS. 2(A) through (C) are graphs of illustrative input signals and output voltage waveforms occurring in the conventional circuit of FIG. 1.
Figure 3:
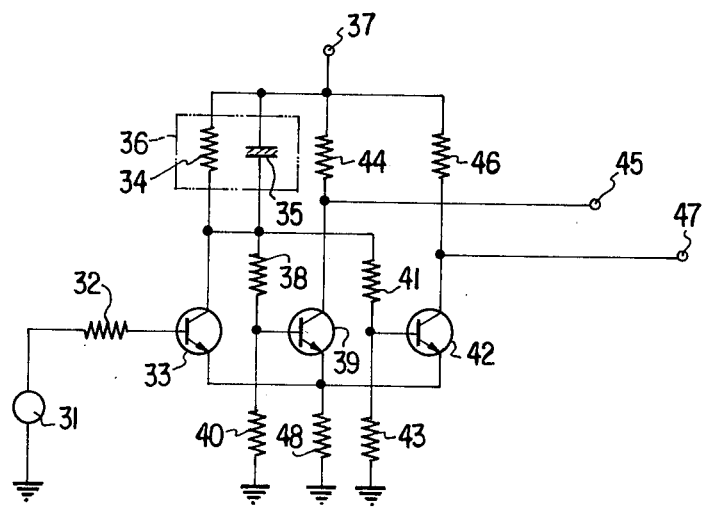
FIG. 3 is a circuit diagram of illustrative output control of circuitry based on the present invention.

In FIG. 3, 31 is an input signal source. Input signal source 31 is connected to the base (the third terminal) of a NPN type first transistor 33 by way of a resistor 32. One end of a time constant circuit 36 comprising a parallel connection of a resistor 34 and a capacitor 35 is connected to the collector (the second terminal) of first transistor 33. The other end of time constant circuit 36 is connected to a power supply terminal 37. The collector of first transistor 33 is also connected to the base (the third terminal) of a NPN type second transistor 39 by way of a resistor 38, the base being grounded through a resistor 40. Further, the collector of first transistor 33 is connected to the base (the third terminal) of a NPN type third transistor 42 by way of a resistor 41, this base being grounded through a resistor 43. The collector of second transistor 39 is directly connected to a first output terminal 45, and also to power supply terminal 37 by way of a resistor 44. The collector of third transistor 42 is connected to a second output terminal 47, and also to power supply terminal 37 by way of a resistor 46. Further, the emitters of first through third transistors 33, 39, and 42 are connected in common, the common connection point being grounded through a resistor 48. The resistors 38, 40, 41 and 43 comprise a bias circuit for second and third transistors 39 and 42 and are so set that resistor 40 equals resistor 43 and resistor 38 > the resistor 41.

The operation of the output control circuit will now be described. The input signal waveform is shown in FIG. 4(A). When the trailing edge of this input signal rises as shown in the diagram, first transistor 33 begins to conduct. As stated above, time constant circuit 36 is connected to the collector of first transistor 33. Consequently, as first transistor 33 becomes conductive, its collector potential falls due to time constant circuit 36—that is, the time constant of resistor 34 and capacitor 35—and approaches ground potential. As also mentioned above, resistors 38, 40, 41 and 43 are so set that resistor 40 equals resistor 43 and the resistor 38 > the resistor 41. Consequently, when the collector potential of first transistor 33 falls with a certain time constant, the second transistor 39 first becomes nonconductive because the base bias of second transistor 39 falls at an early point, which causes the trailing edge of the output voltage of first output terminal 45 to rise as shown in FIG. 4(C). Subsequently, transistor 42 becomes nonconductive, which causes the trailing edge of the output voltage of second output terminal 47 to rise as shown in FIG. 4(B). On the other hand, when the leading edge of the input signal shown in FIG. 4(A) falls as shown in the above diagram in the direction to cause first transistor 33 to become nonconductive, because capacitor 35 is fully charged, the collector potential of first transistor 33 gradually rises due to time constant circuit 36—that is, the time constant of resistor 34 and capacitor 35—and approaches the power supply voltage. Then, due to the difference between the values of resistors 38 and 41, third transistor 42 becomes conductive, which causes the leading edge of the output voltage of second output terminal 47 to fall as shown in FIG. 4(B). Subsequently, the second transistor 39 becomes conductive, which drops the leading edge of the output voltage of first output terminal 45 as shown in FIG. 4(C).

Also, in an output control circuit of the above type, positive feedback operation occurs. This feedback operation will now be described with respect to the rise time of the input signal. When first transistor 33 begins to conduct due to the rising of the input signal, second transistor 39 first becomes nonconductive as described above lowering the potential of the common emitter. This is the direction of more current flow for first transistor 33. Consequently, the collector potential of first transistor 33 further drops, whereby the current flowing to second transistor 39 drops further. Also, when the collector potential of first transistor 33 drops, the base bias of third transistor 42 becomes less than the current also stops flowing to third transistor 42. Then, the current flows to first transistor 33, and the above-mentioned positive feedback operation occurs.

Therefore, when an output control circuit based on this invention as described above is used, it can cause a plurality of output voltages originating from one input signal to rise with staggered timing while causing them to fall with staggered timing in the reverse sequence. Although it is operated the same as its conventional counterpart, it includes a time constant circuit operative at the rise and fall of the first transistor collector potential to supply this potential to the transistors used for the second and subsequent output control signals at respectively varied time constants. Thus, the number of transistors used can be reduced compared to the conventional circuitry thereby resulting in simplified construction and lowered cost. For example, in the above embodiment two output voltages are produced; however, if five output voltages are produced in the above manner, ten transistors would conventionally be required, whereas six transistors are sufficient in the present invention.

The output control circuit of the present invention, and especially the output control circuit of FIG. 3, may be used in an FM Tuner. FIG. 5 shows such a tuner where 51 is an antenna, 52 is front end circuitry, 53 is an intermediate frequency amplifier (IF), 54 is a wave detector, 55 is a phase-locked loop stereo demodulator (PLLMPX circuit hereafter), 56 is an output terminal, and 57 is an FET switch disposed between output terminal 56 and PLLMPX circuit 55. 58 is a signal detection circuit connected to the output of wave detector 54; 59 is an output control circuit corresponding to FIG. 3, it being connected to the output of signal detection circuit 58; 60 is a muting circuit connected to first output terminal 45 of output control circuit 59, it turning off FET switch 57; 61 is a voltage control oscillator (VCO) killer circuit connected to second output terminal 47 of output control circuit 59, it turning off the VCO of PLLMPX circuit 55.

The FM tuner prevents radiation interference from the VCO of PLLMPX circuit 55, thus operating (turning on) the VCO only when FM signals are received. The VCO is turned off by the VCO killer circuit 61 during detuning. At this time, shock noise will occur when the VCO is turned on or off. Therefore, the VCO is turned on or off in conjunction with FET switch 57 by the output control circuit 59. The input signal (input signal of signal detection circuit 58 inputted by the output of wave detector 54) falls when an FM signal is received. In other words, when an FM signal is received, the output voltage at second output terminal 47 of output control circuit 59 (that is, the input voltage of VCO killer circuit 61) first falls. VCO killer circuit 61 thus becomes nonconductive whereby the VCO of PLLMPX circuit 55 is turned on first. Subsequently, the output voltage at first output terminal 45 of output control circuit 59 (that is, the input voltage of muting circuit 60) falls. Muting circuit 60 thus becomes nonconductive which turns on FET switch 57. By turning on the VCO and FET switch 57 in this sequence, shock noise is prevented.

On the other hand, the input signal of output control circuit 59 rises at the time of detuning. Consequently, the output voltage at first output terminal 45 of output control circuit 59 (that is, the input voltage of the muting circuit 60) first rises. Thus, muting circuit 60 becomes conductive whereby FET switch 57 is first turned off. Subsequently, the output voltage at second output terminal 47 of output control circuit 59 (that is, the input voltage of the VCO killer circuit 61) rises. Thus, VCO killer circuit 61 becomes conductive and the VCO is turned off. By turning off the VCO and FET switch 57 in this sequence, shock noise at the time of detuning is also prevented.

In FIG. 3, NPN type transistors are used. The output control circuit may also use field effect transistors, for example, where the drain and source correspond to the first and second terminals, and the gate corresponds to the third terminal.

As described above, simplified construction and lowered cost can be effected with this invention.

What is claimed is:

1. Circuitry for generating from an input signal having leading and trailing edges at least two output control signals where the leading and trailing edges of the first one of said two output control signals respectively precede and follow the leading and trailing edges of the second one of said two output control signals, said circuitry comprising
   a first transistor responsive to said input signal;
   time constant circuit means having a predetermined time constant connected to said first transistor;
   a second and third transistors responsive to said first transistor and said time constant circuit means;
   bias means for so establishing different operating voltages for said second and third transistors that, upon application of said input signal to said first transistor, said first and second output control signals are respectively outputted by second and third transistors due to the fact that they are actuated at different times by the output signal from said first transistor and said time constant circuit depending on whether the input signal is rising or falling.

2. Circuitry as in claim 1 where said transistors are NPN transistors.

3. Circuitry as in claim 1 where said transistors are field effect transistors.

4. Circuitry as in claim 1 where each said transistor has an input and output terminal and control terminal, said input signal being applied to the control terminal of said first transistor and said output signal from said first transistor and said time constant circuit being applied from the output terminal of said first transistor to the control terminals of said second and third transistors via said bias means.

5. Circuitry as in claim 4 where the input terminals of said transistors are connected in common.

6. An FM stereo receiver having at least one output terminal comprising
   means responsive to an FM signal including detecting means for detecting from the FM signal a composite stereo signal frequency modulated thereon;
   a phase-locked loop demodulator having at least two output terminals and a voltage controlled oscillator for demodulating said composite stereo signal to obtain discrete stereo signals;
   at least two switching means respectively disposed between the two outputs of said phase-locked loop demodulator and said receiver output terminal;
   signal detecting means responsive to said composite stereo signal for detecting the presence or absence of said FM signal;
   circuit means as defined in claim 1 responsive to said signal detecting means;
   means responsive to said first output control signal for actuating said voltage controlled oscillator when said FM signal is present; and
   means responsive to said second output control signal for actuating said switching means when said FM signal is present
   whereby undesired radiation from said voltage controlled oscillator is reduced and shock noise is lessened.

* * * * *